US012581967B2

(12) United States Patent
Nam

(10) Patent No.: US 12,581,967 B2
(45) Date of Patent: Mar. 17, 2026

(54) CIRCUIT BOARD AND SEMICONDUCTOR PACKAGE BOARD COMPRISING SAME

(71) Applicant: LG INNOTEK CO., LTD., Seoul (KR)

(72) Inventor: Il Sik Nam, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 494 days.

(21) Appl. No.: 18/022,915

(22) PCT Filed: Aug. 25, 2021

(86) PCT No.: PCT/KR2021/011334
§ 371 (c)(1),
(2) Date: Feb. 23, 2023

(87) PCT Pub. No.: WO2022/045752
PCT Pub. Date: Mar. 3, 2022

(65) Prior Publication Data
US 2023/0307342 A1      Sep. 28, 2023

(30) Foreign Application Priority Data

Aug. 27, 2020     (KR) ........................ 10-2020-0108242

(51) Int. Cl.
H01L 23/498          (2006.01)
H01L 21/48          (2006.01)
H01L 23/00          (2006.01)
(52) U.S. Cl.
CPC ...... H01L 23/49827 (2013.01); H01L 21/481 (2013.01); H01L 24/16 (2013.01);
(Continued)

(58) Field of Classification Search
CPC . H01L 23/49827; H01L 21/481; H01L 24/16; H01L 24/26; H01L 24/29; H01L 24/32; H01L 24/73; H01L 24/83
(Continued)

(56) References Cited

U.S. PATENT DOCUMENTS 6,228,466 B1      5/2001  Tsukada et al.
10,510,672 B2    12/2019  Kim et al.
(Continued)

FOREIGN PATENT DOCUMENTS

JP        2012-164952 A       8/2012
KR   10-2000-0062265 A      10/2000
(Continued)

*Primary Examiner* — Jasmine J Clark
(74) *Attorney, Agent, or Firm* — Birch, Stewart, Kolasch & Birch, LLP

(57)          ABSTRACT

A circuit board according to an embodiment includes an insulating layer; a circuit pattern disposed on the insulating layer, and a first protective layer disposed on the insulating layer, wherein the first protective layer includes a first opening vertically overlapping at least a part of an upper surface of the circuit pattern; wherein an inner wall of the first protective layer constituting the first opening includes: a first portion having a first inclination, and a second portion disposed on the first portion and having a second inclination different from the first inclination, and wherein the first portion overlaps the circuit pattern in a horizontal direction.

20 Claims, 7 Drawing Sheets

(52) U.S. Cl.
CPC .............. *H01L 24/26* (2013.01); *H01L 24/29* (2013.01); *H01L 24/32* (2013.01); *H01L 24/73* (2013.01); *H01L 24/83* (2013.01); *H01L 2224/16227* (2013.01); *H01L 2224/26175* (2013.01); *H01L 2224/2919* (2013.01); *H01L 2224/32225* (2013.01); *H01L 2224/73204* (2013.01); *H01L 2224/83007* (2013.01); *H01L 2224/83102* (2013.01); *H01L 2224/83104* (2013.01); *H01L 2924/0665* (2013.01)

(58) Field of Classification Search
USPC ......................................................... 257/737
See application file for complete search history.

(56) References Cited

U.S. PATENT DOCUMENTS

| | | | |
|---|---|---|---|
| 10,950,587 B2 * | 3/2021 | Jeon ...................... | H01L 25/105 |
| 2010/0271792 A1 | 10/2010 | Choi et al. | |
| 2012/0186861 A1 | 7/2012 | Shimizu et al. | |

FOREIGN PATENT DOCUMENTS

| | | |
|---|---|---|
| KR | 10-2010-0117810 A | 11/2010 |
| KR | 10-2019-008723 A | 1/2019 |
| KR | 20-2020-0000700 U | 4/2020 |
| KR | 10-2020-0051215 A | 5/2020 |

* cited by examiner

【FIG. 1】
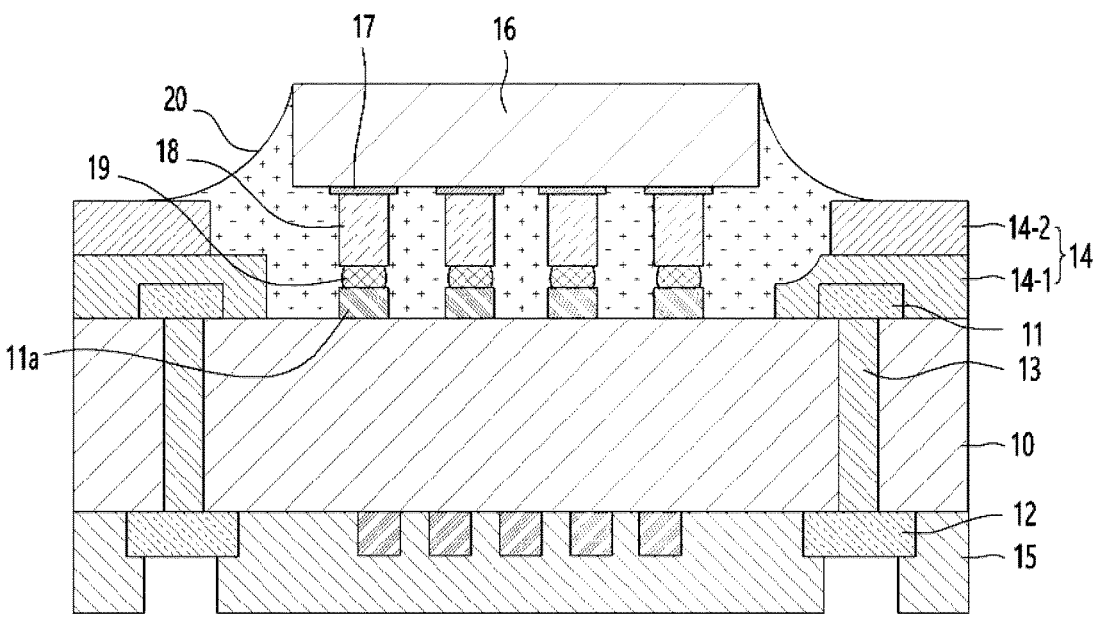
【FIG. 2】
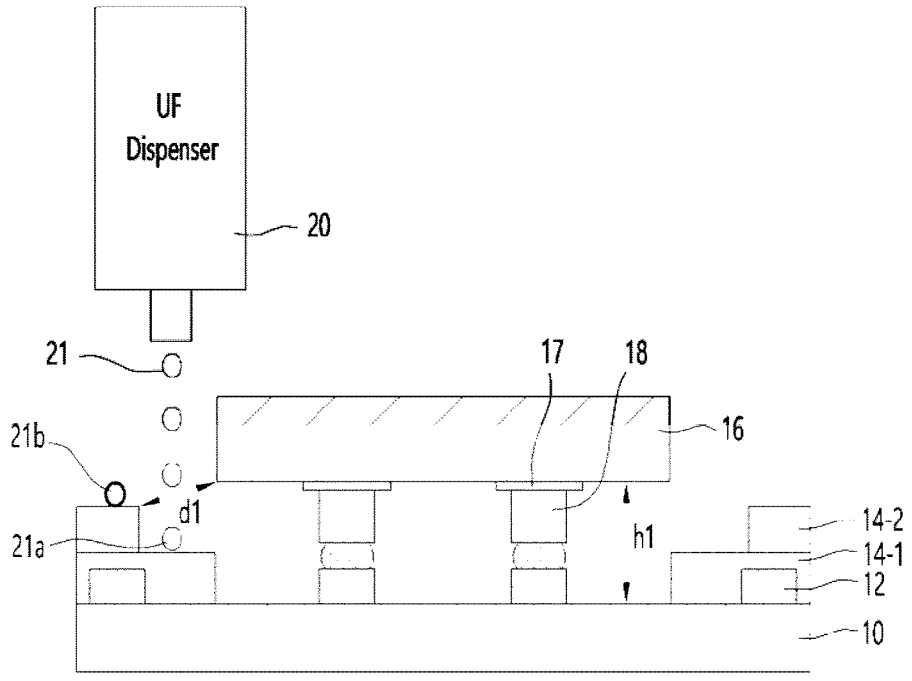

【FIG. 3】
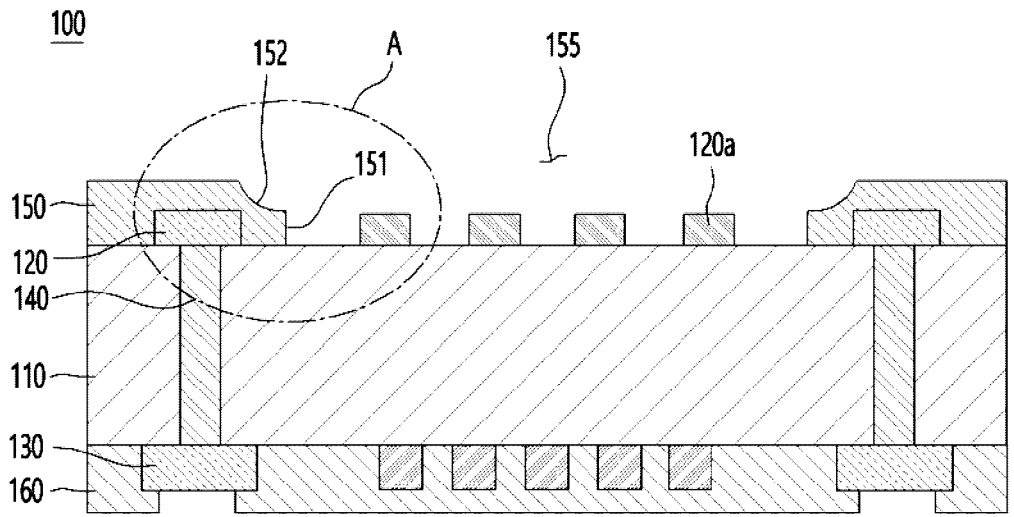
【FIG. 4】
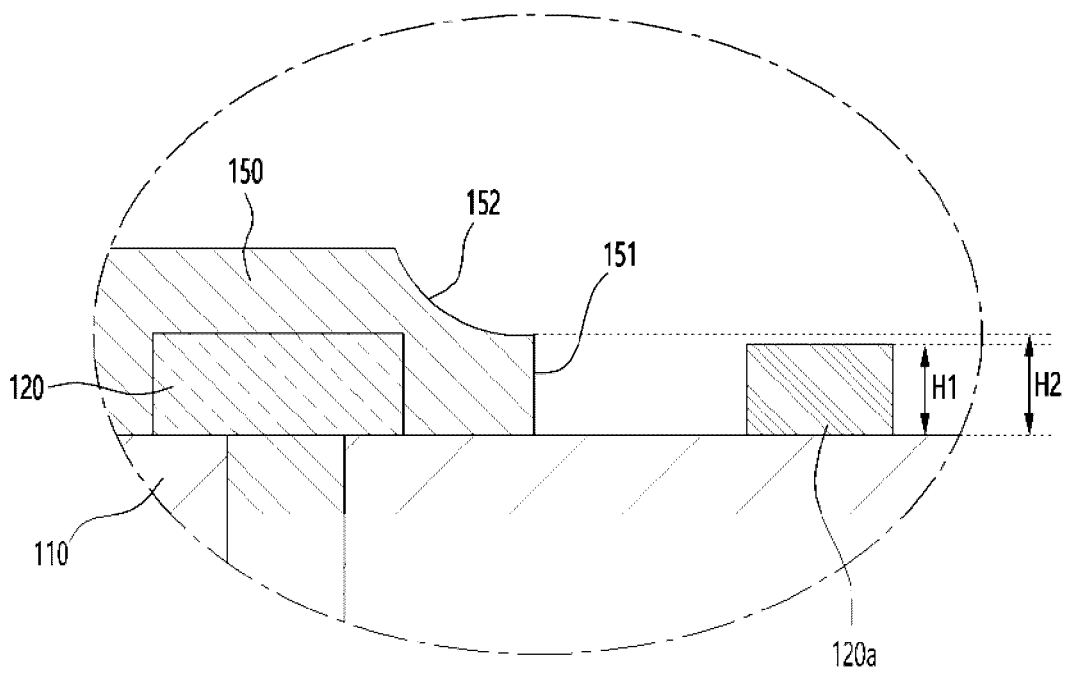

【FIG. 5】
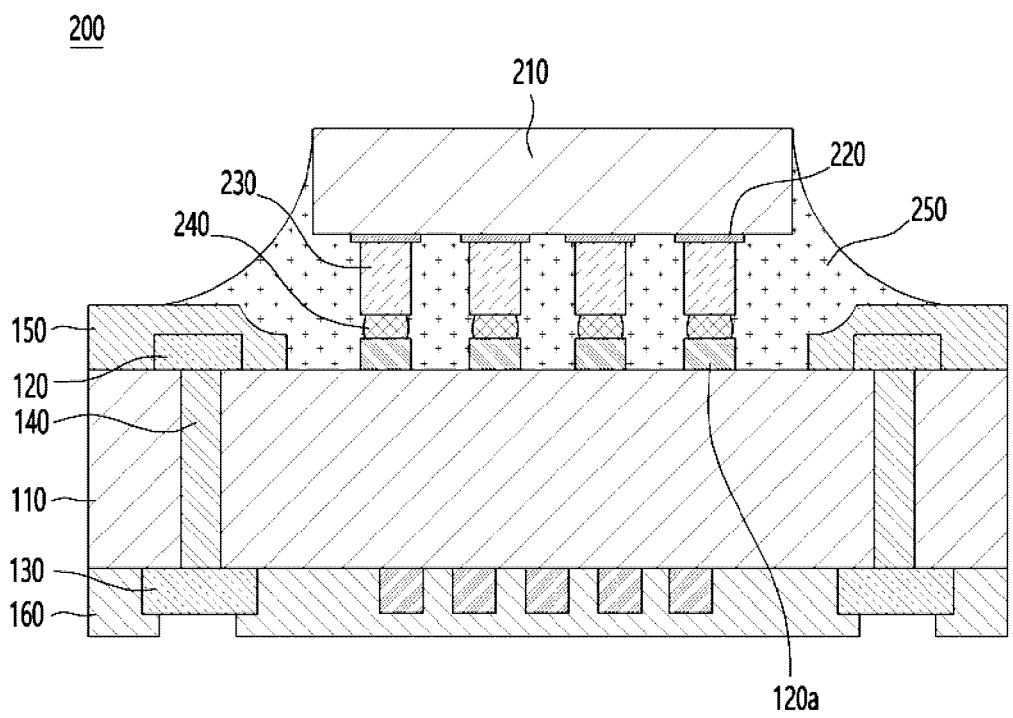

【FIG. 6】
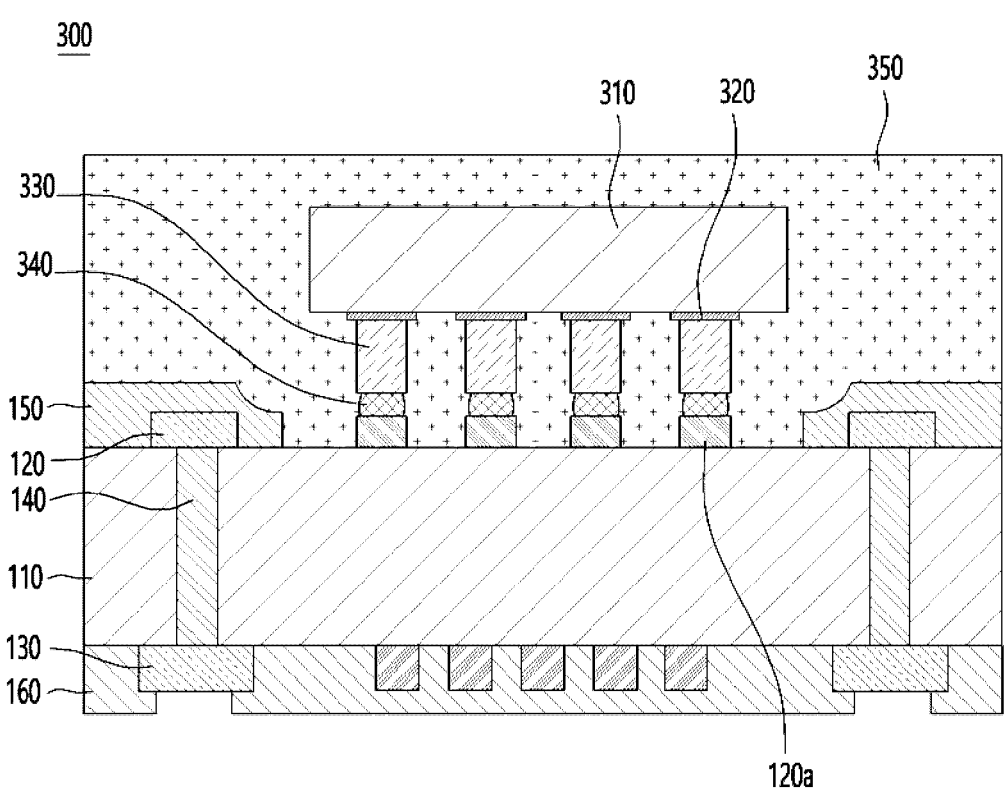

【FIG. 7】
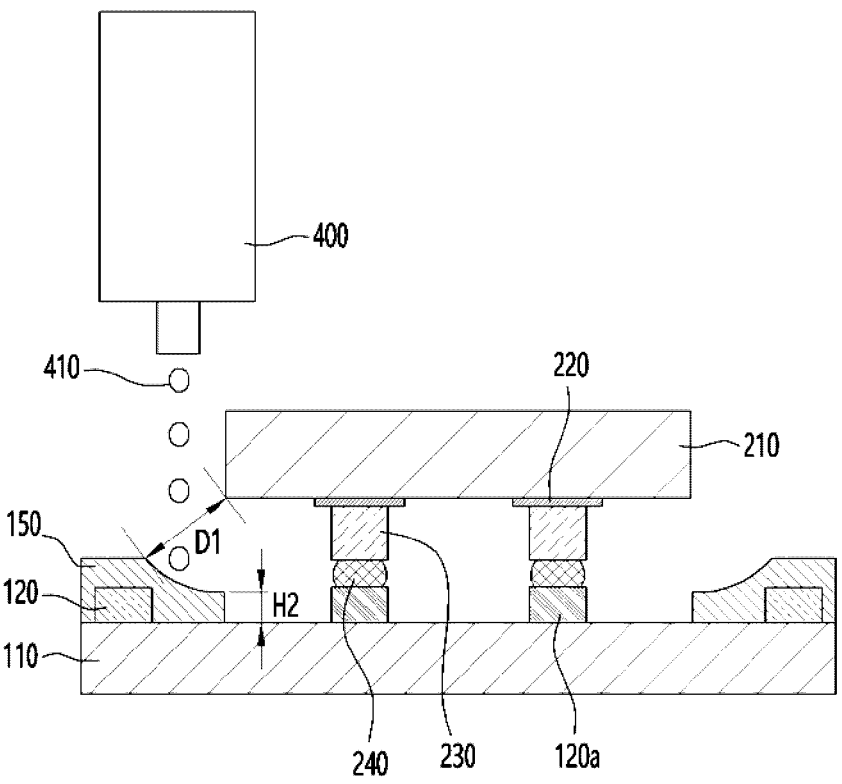
【FIG. 8】
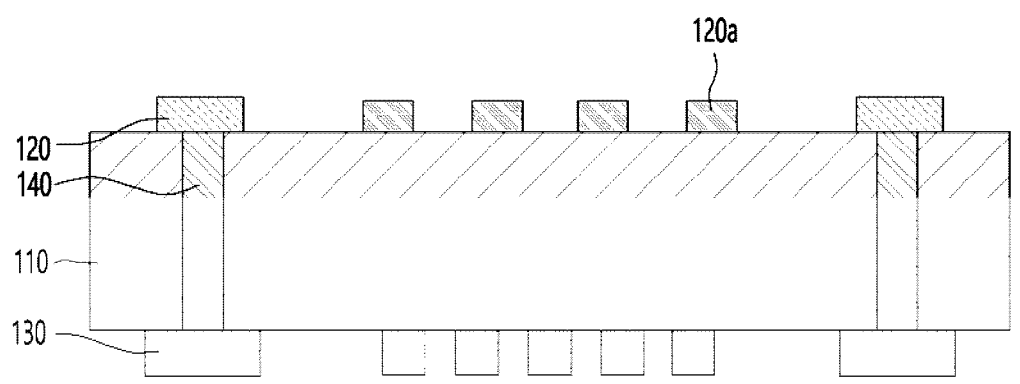

【FIG. 9】
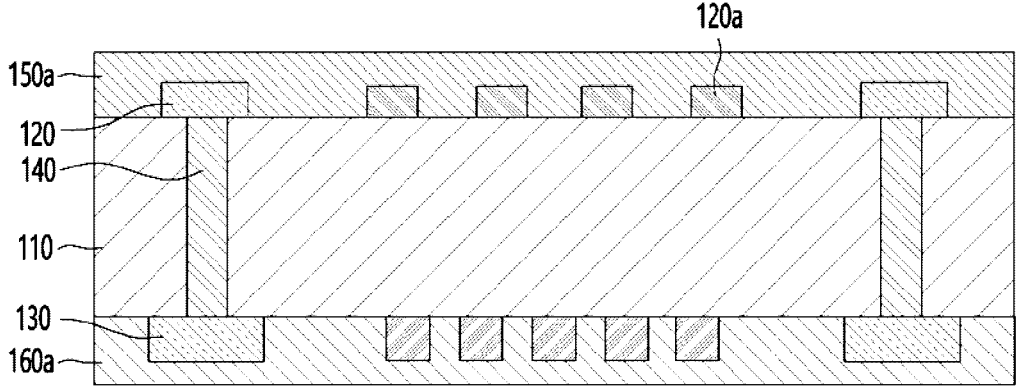
【FIG. 10】
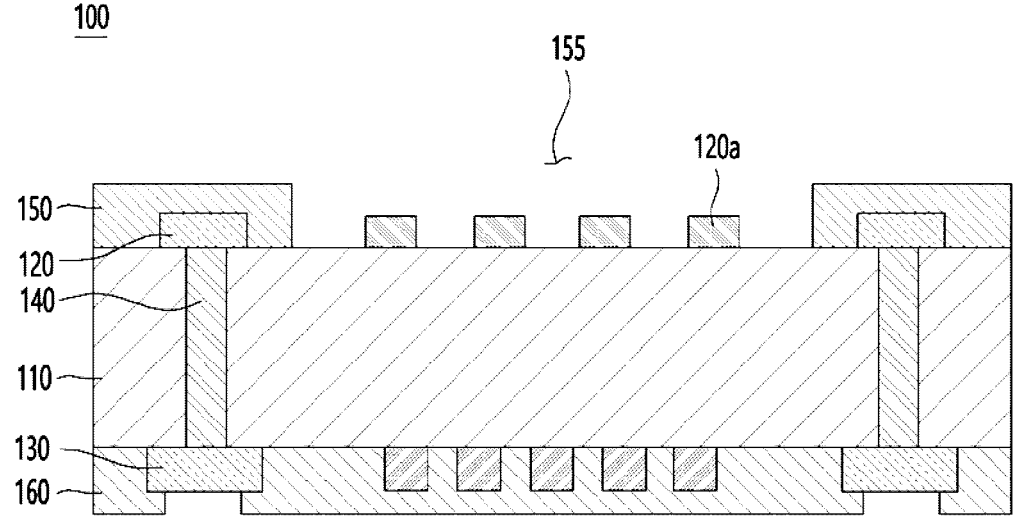

【FIG. 11】
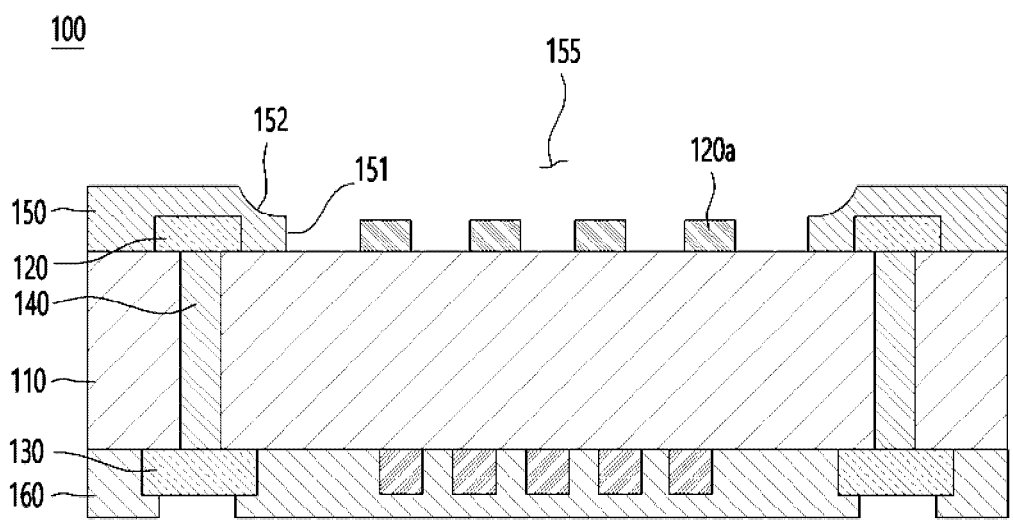
【FIG. 12】
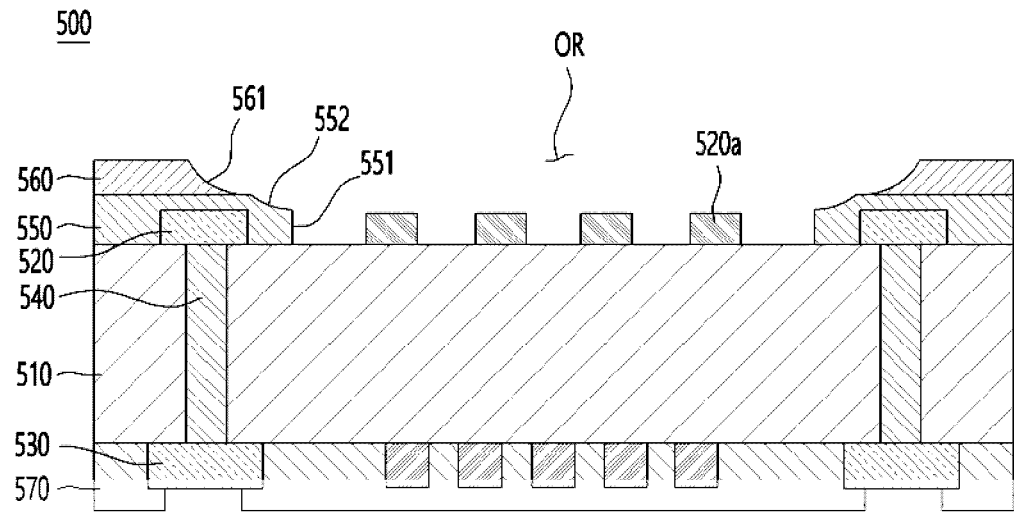

CIRCUIT BOARD AND SEMICONDUCTOR PACKAGE BOARD COMPRISING SAME

CROSS REFERENCE TO RELATED APPLICATIONS

This application is the National Phase of PCT International Application No. PCT/KR2021/011334, filed on Aug. 25, 2021, which claims priority under 35 U.S.C. 119(a) to Patent Application No. 10-2020-0108242, filed in Republic of Korea on Aug. 27, 2020, all of which are hereby expressly incorporated by reference into the present application.

BACKGROUND

Technical Field

An embodiment relates to a circuit board and a semiconductor package substrate comprising the circuit board.

Discussion of the Related Art

A line width of the circuit is miniaturized as miniaturization, weight reduction, and integration of electronic components accelerate. In particular, a circuit line width of a package substrate or a printed circuit board on which a semiconductor chip is mounted has been miniaturized to a several micrometer or less by integrating design rules of a semiconductor chip on a nanometer scale.

Various methods have been proposed in order to increase a circuit integration degree of the printed circuit board, that is, to refine the circuit line width. For example, a semi-additive process (SAP) method and a modified semi-additive process (MSAP) have been proposed in order to prevent loss of circuit line width in a process of etching to form a pattern after copper plating.

Such a printed circuit board may be used as a package substrate on which a device is mounted and the mounted device is buried through underfilling or molding. However, a conventional package substrate has a reliability problem due to not securing an injection space for an underfill material or an epoxy material for the underfill or molding.

SUMMARY

An embodiment provides a circuit board with a novel structure, a semiconductor package substrate, and a method for manufacturing the same.

In addition, the embodiment provides a circuit board of securing a stable underfill dispensing space region, a semiconductor package substrate, and a method for manufacturing the same.

In addition, the embodiment provides a circuit board of capable of solving various reliability problems by maximizing injectability of a material for underfilling or molding, a semiconductor package substrate, and a method for manufacturing the same.

The technical problem to be solved in the embodiment is not limited to the technical problem mentioned above, and another technical problem not mentioned will be clearly understood by those of ordinary skill in the art to which the present invention belongs from the following description.

A circuit board according to an embodiment comprises an insulating layer; a circuit pattern disposed on the insulating layer; and a first protective layer disposed on the insulating layer, wherein the first protective layer includes a first opening vertically overlapping at least a part of an upper surface of the circuit pattern; wherein an inner wall of the first protective layer constituting the first opening includes: a first portion having a first inclination, and a second portion disposed on the first portion and having a second inclination different from the first inclination, and wherein the first portion overlaps the circuit pattern in a horizontal direction.

In addition, the first portion is adjacent to a lower surface of the first protective layer, and the second portion is adjacent to an upper surface of the first protective layer.

In addition, the second portion of the inner wall of the first protective layer includes a curved surface having a first curvature.

In addition, the first inclination is perpendicular to a lower surface of the first protective layer.

In addition, a surface roughness of the first portion of the first protective layer is different from a surface roughness of the second portion of the first protective layer.

In addition, a height of the first portion of the first protective layer is higher than or equal to a height of the circuit pattern.

In addition, the circuit board further comprises a second protective layer disposed on the first protective layer, and wherein the second protective layer includes a second opening vertically overlapping the first opening.

In addition, an inner wall of the second opening of the second protective layer includes a curved surface connected to the second portion of the first protective layer and having a second curvature different from the first curvature.

In addition, the second curvature is greater than the first curvature.

On the other hand, a package substrate according to an embodiment comprises an insulating layer; a circuit pattern disposed on the insulating layer; and a first protective layer disposed on the insulating layer and including a first opening vertically overlapping at least a part of an upper surface of the circuit pattern; a device mounted on an upper surface of the circuit pattern vertically overlapping the first opening; and a cover portion covering the first opening and the device; wherein an inner wall of the first protective layer constituting the first opening includes a first portion having a first inclination, and a second portion disposed on the first portion and having a second inclination different from the first inclination, and wherein the first portion overlaps the circuit pattern in a horizontal direction, wherein the first inclination is perpendicular to a lower surface of the first protective layer, wherein the second portion of the inner wall of the first protective layer includes a curved surface having a first curvature, wherein a surface roughness of the first portion of the first protective layer is different from a surface roughness of the second portion of the first protective layer, and wherein a height of the first portion of the first protective layer is higher than or equal to a height of the circuit pattern.

In addition, the cover portion includes an underfill portion covering a lower region of the device or a molding layer molding the device.

Advantageous Effects

In the embodiment, a process of processing an opening in a first protective layer composed of one layer is performed twice so that at least a part of an inner wall of the opening of the first protective layer has a curved surface. Accordingly, the embodiment allows an underfill material or an epoxy material to be stably injected into the opening through a portion having the curved surface. For example, the first protective layer includes a first portion and a second portion, and the second part may have a curved surface. Accordingly, a dispensing space determined by a distance from an uppermost end of the second portion to a lower end of a device can be sufficiently secured when the second portion of the first protective layer has a curved surface. In addition, when injecting an underfill material or an epoxy material on the second portion of the first protective layer, the underfill material or the epoxy material can be naturally injected into the opening along the curved surface of the second portion by having the curved surface of the second portion of the first protective layer, and accordingly, the capillary can be maximized.

Meanwhile, an inner wall of the opening of the first protective layer may have the same curved surface as the second portion as a whole. However, in this case, an underfill material or an epoxy material injected into the opening may flow out of the opening. In other words, when the inner wall of the opening has a curved surface as a whole, the inner wall of the opening does not serve as a dam to trap the underfill material or the epoxy material injected into the opening, and this may cause an underfill material or an epoxy material injected into the opening to again flow out of the opening. In contrast, the embodiment allows the inner wall of the opening of the first protective layer to include a first portion of a plane having a first inclination angle. The first portion may be substantially perpendicular to an upper surface of the insulating layer. Accordingly, the embodiment may allow the first portion to function as a dam for confining the underfill material or the epoxy material injected into the opening, thereby improving reliability.

In addition, the embodiment can minimize a height of a connection portion disposed on a device as the first protective layer is composed of one layer, and so that, an overall height of a package substrate may be reduced compared to a comparative example. Accordingly, the embodiment can achieve slimming of the package substrate.

BRIEF DESCRIPTION OF THE DRAWINGS

FIG. 1 is a view showing a package substrate of a comparative example.

FIG. 2 is a view for explaining problems of an underfill process in the package substrate of the comparative example of FIG. 1.

FIG. 3 is a view showing a circuit board according to a first embodiment.

FIG. 4 is an enlarged view of region A of FIG. 3.

FIG. 5 is a view showing a package substrate according to a first embodiment.

FIG. 6 is a view showing a package substrate according to a second embodiment.

FIG. 7 is a view for explaining an underfill process of a package substrate according to an embodiment.

FIGS. 8 to 11 are views for explaining a method for manufacturing a circuit board according to a first embodiment shown in FIG. 3 in order of processes.

FIG. 12 is a view showing a circuit board according to a second embodiment.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

In addition, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

In addition, when expressed as "on (over)" or "under (below)," it may include not only the upper direction but also the lower direction based on one element.

FIG. 1 is a view showing a package substrate of a comparative example, and FIG. 2 is a view for explaining problems of an underfill process in the package substrate of the comparative example of FIG. 1.

Referring to FIGS. 1 and 2, a package substrate of a comparative example comprises a circuit board including an insulating layer 10, circuit patterns 11 and 12, a via 13, a first protective layer 14, and a second protective layer 15.

In addition, a circuit pattern 11 disposed on an uppermost layer of the circuit patterns 11 and 12 of the circuit board includes a pad 11*a* vertically overlapping an opening of the first protective layer 14.

In addition, the package substrate includes an adhesive portion 19 disposed on the pad 11*a*. In addition, a device 16 is mounted on the adhesive portion 19.

In this case, an under-bump metal (UBM) 17 is formed under a lower surface of the device 16. In addition, a connection portion 18 is formed under the UBM (Under Bump Metal, 17). The connection portion 18 is generally referred to as a copper pillar.

That is, the UBM 17 and the connection portion 18 are disposed under a lower surface of the device 16, the adhesive portion 19 is disposed on an upper surface of the pad 11*a*, and accordingly, the device 16 may be mounted on the circuit board by attaching the connection portion 18 to the adhesive portion 19.

Meanwhile, an underfill process for protecting the device is performed after the device 16 is mounted. The underfill process is performed by injecting an underfill material into the opening of the first protective layer 14 and curing the underfill material.

In this case, the first protective layer 14 has a two-layer structure to secure an injection space for the underfill material in the underfill process.

That is, the first protective layer 14 includes a first-first protective layer 14-1 disposed on an upper surface of the insulating layer 10 and a first-second protective layer 14-2 disposed on the first-first protective layer 14-1.

In this case, each of the first-first protective layer 14-1 and the first-second protective layer 14-2 have an opening. In addition, a size of the opening of the first-first protective layer 14-1 is smaller than that of the opening of the first-second protective layer 14-2. Accordingly, the first-first protective layer 14-1 and the first-second protective layer 14-2 have a layered structure.

In other words, the comparative example provides a two-layer protective layer and the two-layer protective layer has a step, so that the comparative example allows the underfill or mold epoxy to be injected into or around the region in which the device is mounted. In this case, the comparison example allows the first protective layer to have a two-layer structure with a step, so that the underfill or epoxy material can flow stably into the region where the device is mounted.

However, the package substrate of the comparative example includes a first protective layer having a two-layer structure according to a package design, and accordingly, there is a limit to reducing an overall height of the package substrate. Specifically, a height of the connection portion 18 is determined based on an upper surface of the first-second protective layer 14-2 of the first protective layer 14, and accordingly, the package substrate of the comparative example has a problem in that the height of the connection portion 18 increases, and thus the overall height h1 of the substrate increases.

In addition, the package substrate of the comparative example secures a dispensing space through which an underfill or epoxy material can stably flow into the device mounting space by increasing a width of the opening of the first-second protective layer 14-2 compared to a width of the first-first protective layer 14-1. In this case, when the width of the first-second protective layer 14-2 is small, the capillary of the underfill or the epoxy material is deteriorated, and thus a flowability of the epoxy is deteriorated, and a problem in which underfill is not normally performed or a quality problem such as void occurs.

Specifically, when the width of the first-second protective layer 14-2 is too small, the package substrate of the comparative example does not secure the dispensing space d1, accordingly, even if some of particles 21*a* of particles 21 coming out of an underfill dispenser 20 flow into the device mounting space, the number of particles 21*b* falling out of the device mounting space increases. In addition, when the amount of the particles 21*b* falling out increases, there is a problem in that the amount of the underfill material or the epoxy material that is indiscriminately wasted increases, and thus the manufacturing cost increases. Furthermore, when the amount of the particles 21*b* falling out increases, a process time in the process of filling the device mounting space with underfill material or epoxy material may increase.

In addition, when the width of the first-second protective layer 14-2 is too large, the package substrate of the comparative example has a dispensing space d1 that is too wide, accordingly, there is a problem in that the amount of the underfill material or the epoxy material increases and the cost increases. In addition, when the width of the first-second protective layer 14-2 is too large, the underfill material or epoxy material remaining on the upper surface of the first-first protective layer 14-1 does not flow into the device mounting space, and thus a reliability problem occurs.

Accordingly, the embodiment provides a circuit board capable of improving the injection flow of an underfill material or an epoxy material and reducing an overall height of a package substrate while securing a dispensing space, a semiconductor package substrate, and a method for manufacturing the same.

FIG. 3 is a view showing a circuit board according to a first embodiment, and FIG. 4 is an enlarged view of region A of FIG. 3.

Referring to FIGS. 3 and 4, a circuit board includes an insulating layer 110, a first circuit pattern 120, a second circuit pattern 130, a via 140, a first protective layer 150, and a second protective layer 160.

The insulating layer 110 may represent any one specific layer in a plurality of stacked structures. The insulating layer 110 is a board on which an electric circuit capable of changing wiring is organized, and may include a printed circuit board, a wiring board, and an insulating board made of an insulating material capable of forming circuit patterns on a surface thereof.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the insulating layer 110 may include an optically isotropic film. As an example, the insulating layer 110 may include cyclic olefin copolymer (COC), cyclic olefin polymer (COP), optically isotropic PC, optically isotropic polymethylmethacrylate (PMMA), or the like.

In addition, the insulating layer 110 may be partially bent while having a curved surface. That is, the insulating layer 110 may partially have a plane and may partially be bent while having a curved surface. Specifically, an end portion of the insulating layer 110 may be bent while having a curved surface, or bent or crooked while having a surface with a random curvature.

In addition, the insulating layer 110 may be a flexible substrate having flexibility. Further, the insulating layer 110 may be a curved or bent substrate. In this case, the insulating layer 110 expresses electric wiring connecting circuit components in a wiring diagram based on the circuit design, and can reproduce an electric conductor on an insulator. In addition, the insulating layer 110 may mount electrical components and form wires connecting them in a circuit manner, and may mechanically fix components other than the electrical connection function of the components.

A circuit pattern may be disposed on a surface of the insulating layer 110.

For example, a first circuit pattern 120 may be formed on an upper surface of the insulating layer 110. In addition, a second circuit pattern 130 may be formed under a lower surface of the insulating layer 110.

The first circuit pattern 120 may be formed to protrude from the upper surface of the insulating layer 110.

A lower surface of the first circuit pattern 120 may contact an upper surface of the insulating layer 110.

The second circuit pattern 130 may protrude and be disposed under the lower surface of the insulating layer 110. That is, the upper surface of the second circuit pattern 130 may directly contact the lower surface of the insulating layer 110. However, the embodiment is not limited thereto, and a seed metal layer (not shown) of the second circuit pattern 130 may be disposed between the upper surface of the second circuit pattern 130 and the lower surface of the insulating layer 110.

That is, the package substrate of the embodiment is manufactured by the SAP or MSAP method, and accordingly, the first circuit pattern 120 and the second circuit pattern 130 may have structures protruding from the upper and lower surfaces of the insulating layer 110, respectively. However, the embodiment is not limited thereto, and at least one of the first circuit pattern 120 and the second circuit pattern 130 may have a structure buried in the insulating layer 110.

The first circuit pattern 120 and the second circuit pattern 130 may be a wiring for transmitting an electrical signal, and may be formed of a metal material having high electrical conductivity. For this, the first circuit pattern 120 and the second circuit pattern 130 may be formed of at least one metal material selected from among gold (Au), silver (Ag), platinum (Pt), titanium (Ti), tin (Sn), copper (Cu), and zinc (Zn). In addition, the first circuit pattern 120 and the second circuit pattern 130 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the first circuit pattern 120 and the second circuit pattern 130 may be formed of copper (Cu) having high electrical conductivity and a relatively low cost.

The first circuit pattern 120 may include a pad 120a disposed on an upper surface of the insulating layer 110 and vertically overlapping an opening 155 of the first protective layer 150. The pad 120a may be disposed on the upper surface of the insulating layer 110 and vertically overlap the opening 155 of the first protective layer 150. The pad 120a may be a device mounting pad for mounting a device on a package substrate.

A via 140 may be disposed in the insulating layer 110. The via 140 is disposed in the insulating layer 110 and thus may electrically connect circuit patterns disposed on different layers to each other.

That is, the via 140 is disposed in the insulating layer 110 so that an upper surface of the via can be connected to the lower surface of the first circuit pattern 120 and a lower surface of the via can be connected to the upper surface of the second circuit pattern 130.

The via 140 may be formed by filling an inside of a via hole formed in the insulating layer 110 with a metal material.

The via hole may be formed by any one of mechanical, laser, and chemical processing. When the via hole is formed by machining, it can be formed using methods such as milling, drilling, and routing. When the via hole is formed by laser processing, it can be formed using methods such as UV or CO2 laser. When the via hole is formed by chemical processing, it can be formed using a chemical containing amino silane, ketones, or the like. Accordingly, the insulating layer 110 may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has the advantage of a wide range of processable thicknesses.

A laser processing drill preferably uses a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the via 140 may be formed by filling the inside of the through hole with a conductive material. The metal material forming the via 140 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting, and dispensing.

A first protective layer 150 may be disposed on an upper surface of the insulating layer 110, and a second protective layer 160 may be disposed under a lower surface of the insulating layer 110. The first protective layer 150 may be disposed on the upper surface of the insulating layer 110 to have a certain height to protect the upper surface of the insulating layer 110 and the first circuit pattern 120. The first protective layer 150 may be a solder resist (SR), but is not limited thereto.

The second protective layer 160 may be disposed below the lower surface of the insulating layer 110 at a certain height to protect the lower surface of the insulating layer 110 and the second circuit pattern 130. The second protective layer 160 may be solder resist (SR), but is not limited thereto.

The first protective layer 150 includes an opening 155 vertically overlapping the pad 120a among the first circuit patterns 120 disposed on the upper surface of the insulating layer 110.

In addition, the second protective layer 160 may include an opening (not shown) vertically overlapping the lower surface of at least one of the second circuit patterns 130 disposed on the lower surface of the insulating layer 110.

The opening 155 of the first protective layer 150 may have a different upper and lower width. An upper portion of the opening 155 of the first protective layer 150 may have a greater width than a lower portion. The first protective layer 150 is a single layer. In addition, the first protective layer 150 has a one-layer structure.

An inner wall of the opening 155 of the first protective layer 150 may have a different inclination angle for each region. Here, the inner wall may be referred to as an inner wall of the opening 155. In addition, the inner wall may be referred to as an inner wall of the first protective layer 150 including the opening 155. Hereinafter, the inner wall will be described as being mixed with the inner wall of the first protective layer 150 and the inner wall of the opening 155.

For example, the inner wall of the opening 155 may include a first portion 151 adjacent to the upper surface of the insulating layer 110 and a second portion 152 extending from the first portion 151. The first portion 151 may have a first inclination, and the second portion 152 may have a second inclination different from the first inclination.

A first portion 151 of the inner wall of the opening 155 may extend upward from the lower surface of the first protective layer 150. In addition, the second portion 152 of the inner wall of the opening 155 may extend downward from the upper surface of the first protective layer 150.

The first portion 151 of the inner wall of the first protective layer 150 or the first portion 151 of the inner wall of the opening 155 may overlap the first circuit pattern 120 in a horizontal direction.

The first portion 151 and the second portion 152 of the opening 155 may form an inner wall of the opening 155 or an inner wall of the first protective layer 150.

The first portion 151 and the second portion 152 of the opening 155 may have different surface roughness. For example, the first portion 151 and the second portion 152 of the opening 155 may be formed by different methods.

The first portion 151 of the opening 155 may be formed by an etching process. For example, the first portion 151 of the opening 155 may be formed by exposure and development processes. Accordingly, the first portion 151 of the opening 155 may have a first inclination angle. For example, the first portion 151 of the opening 155 may be substantially perpendicular to the upper surface of the insulating layer 110 or the lower surface of the first protective layer 150. The first portion 151 of the opening 155 may be formed through exposure and development processes, and thus may have a first surface roughness. For example, the first portion 151 of the opening 155 may be a plane having a first inclination angle.

The second portion 152 of the opening 155 may be formed by a laser process. For example, the second portion 152 of the opening 155 may be a portion processed by at least one of a YAG (Yttrium Aluminum Garnet) laser, a CO2 laser, and an ultraviolet (UV) laser. The second portion 152 may correspond to a shape or size of a beam used in the laser processing. For example, the second portion 152 may have a curved surface. For example, the second portion 152 may be a curved surface whose width changes from a lower end to an upper end. For example, the second portion 152 of the opening 155 may be a curved surface having a first curvature. The second portion 152 of the opening 155 may be formed by a laser process, and thus may have a second surface roughness. For example, the second portion 152 of the opening 155 may have a second surface roughness greater than the first surface roughness of the first portion 151.

In the embodiment, an opening is formed in the first protective layer 150 through two processing processes, and thus, at least a part of the first protective layer 150 has a curved surface. Accordingly, the embodiment enables an underfill material or an epoxy material to be stably injected into the opening 155 through the second portion 152 having the curved surface.

For example, the second portion 152 of the first protective layer 150 has a curved surface. Accordingly, the second portion 152 of the first protective layer 150 has a curved surface, so that a dispensing space determined by a distance from an uppermost end of the second portion 152 to a lower end of the device can be sufficiently secured. In addition, the second portion 152 of the first protective layer 150 has a curved surface, and so that when injecting an underfill material or an epoxy material on the second portion 152 of the first protective layer 150, the underfill material or the epoxy material may naturally flow into the opening 155 along the curved surface of the second portion 152, thereby maximizing the capillary.

Meanwhile, an inner wall of the opening 155 of the first protective layer 150 may entirely have a curved surface as the second portion 152. However, in this case, an underfill material or an epoxy material injected into the opening 155 may flow out of the opening 155. In other words, when the inner wall of the opening 155 has a curved surface as a whole, the inner wall of the opening 155 does not serve as a dam to trap the underfill material or the epoxy material injected into the opening 155, and this may cause an underfill material or an epoxy material injected into the opening 155 to again flow out of the opening 155.

Accordingly, the embodiment allows the first portion 151 of the inner wall of the opening 155 of the first protective layer 150 to have a first inclination. A first inclination of the first portion 151 may be substantially perpendicular to the upper surface of the insulating layer 110.

Accordingly, the embodiment may allow the first portion 151 to function as a dam for confining the underfill material or the epoxy material injected into the opening 155, thereby improving reliability.

The first portion 151 of the inner wall of the opening 155 may have a second height H2. The second height H2 may correspond to a distance from the upper surface of the insulating layer 110 to an uppermost end of the first portion 151 or a thickness of the first portion 151.

The second height H2 of the first portion 151 may be determined by a first height H1 of the pad 120a.

For example, when an underfill material or an epoxy material is injected into the opening 155, the injected underfill material or epoxy material must stably cover at least the upper surface of the pad 120a.

Accordingly, the second height H2 of the first portion 151 corresponds to the first height H1 of the pad 120a, so that the underfill material or the epoxy material can stably cover up to the upper surface where the pad 120a is disposed. Preferably, the second height H2 of the first portion 151 may be the same as the first height H1 of the pad 120a. For example, the second height H2 of the first portion 151 may be 100% to 150% of the first height H1 of the pad 120a.

FIG. 5 is a view showing a package substrate according to a first embodiment.

Referring to FIG. 5, the package substrate 200 includes the circuit board 100 shown in FIG. 3.

In addition, the package substrate 200 may include a device 210, an under-bump metal (UBM) 220, a connection portion 230, a contacting portion 240, and an underfill portion 250. The underfill portion 250 may also be referred to as a cover portion covering the device 210.

Specifically, the device 210 may be mounted on the pad 120a of the package substrate 200. In this case, an under-bump metal (UBM) 210 is disposed under a lower surface of the device 210.

In addition, a connection portion 230 may be disposed under a lower surface of the UBM (Under Bump Metal) 210. For example, the device 210 may have a structure including an Under Bump Metal (UBM) 210 and a connection portion 230.

The package substrate may attach or mount the device 210 by reflowing the contacting portion 240 in a state in which the contacting portion 240 is disposed on the pad 120a of the circuit board, in a state in which the connection portion 230 disposed on the device 210 is aligned with the contacting portion 240.

The contacting portion 240 may include at least one of copper (Cu), tin (Sn), aluminum (AI), zinc (Zn), indium (In), lead (Pb), antimony (Sb), bismuth (bi), silver (Ag), Nickel (Ni). For example, the adhesive portion 240 may be a solder bump. For example, the contacting portion 240 may be a solder ball, and thus may be melted at a temperature of a reflow process.

An underfill portion 250 may be formed in the opening 155 of the first protective layer 150.

The underfill portion 250 may be disposed and covered a part of a side surface of the device 210. For example, the underfill portion 250 may cover a part of the side surface of the device 210, the pad 120a of the circuit board, the Under Bump Metal (UBM) 220, the connection portion 230, and the contacting portion 240 while filling the opening 155.

FIG. 6 is a view showing a package substrate according to a second embodiment.

Referring to FIG. 6, the package substrate 300 includes the circuit board 100 shown in FIG. 3.

In addition, the package substrate 300 may include a device 310, an Under Bump Metal (UBM) 320, a connection portion 330, a contacting portion 340, and a molding portion 350. The molding portion 350 may also be referred to as a molding layer, and may also be referred to as a cover portion covering the device 310.

Specifically, the device 310 may be mounted on the pad 120a of the package substrate 300. In this case, an Under Bump Metal (UBM) 310 is disposed under a lower surface of the device 310.

In addition, a connection portion 330 may be disposed under a lower surface of the Under Bump Metal (UBM) 310. For example, the device 310 may have a structure including an Under Bump Metal (UBM) 310 and a connection portion 330.

The package substrate may attach or mount the device 310 by reflowing the contacting portion 340 in a state in which the contacting portion 340 is disposed on the pad 120a of the circuit board, in a state in which the connection portion 330 disposed on the device 310 is aligned with the contacting portion 340.

The contacting portion 340 may include at least one of copper (Cu), tin (Sn), aluminum (Al), zinc (Zn), indium (In), lead (Pb), antimony (Sb), bismuth (bi), silver (Ag), and Nickel (Ni). For example, the adhesive portion 240 may be a solder bump. For example, the contacting portion 340 may be a solder ball, and thus may be melted at a temperature of a reflow process.

A molding portion 350 may be formed in the opening 155 of the first protective layer 150.

The molding portion 350 may entirely cover the device 310. For example, the molding portion 350 may cover entirety of the device 310, the pad 120a of the circuit board, the Under Bump Metal (UBM) 320, and the connection portion 330, the contacting portion 340 while filling the opening 155.

Accordingly, an upper surface of the molding portion 350 may be positioned higher than an upper surface of the device 310. The molding portion 350 may be EMC (Epoxy Mold Compound), but is not limited thereto.

In the embodiment, a process of processing an opening in a first protective layer composed of one layer is performed twice so that at least a part of an inner wall of the opening of the first protective layer has a curved surface. Accordingly, the embodiment allows an underfill material or an epoxy material to be stably injected into the opening through a portion having the curved surface. For example, the first protective layer includes a first portion and a second portion, and the second portion may have a curved surface. Accordingly, a dispensing space determined by a distance from an uppermost end of the second portion to a lower end of a device can be sufficiently secured when the second portion of the first protective layer has a curved surface. In addition, when injecting an underfill material or an epoxy material on the second portion of the first protective layer, the underfill material or the epoxy material can be naturally injected into the opening along the curved surface of the second portion by having the curved surface of the second portion of the first protective layer, and accordingly, the capillary can be maximized.

Meanwhile, an inner wall of the opening of the first protective layer may have the same curved surface as the second portion as a whole. However, in this case, an underfill material or an epoxy material injected into the opening may flow out of the opening. In other words, when the inner wall of the opening has a curved surface as a whole, the inner wall of the opening does not serve as a dam to trap the underfill material or the epoxy material injected into the opening, and this may cause an underfill material or an epoxy material injected into the opening to again flow out of the opening. In contrast, the embodiment allows the inner wall of the opening of the first protective layer to include a first portion of a plane having a first inclination angle. The first portion may be substantially perpendicular to an upper surface of the insulating layer. Accordingly, the embodiment may allow the first portion to function as a dam for confining the underfill material or the epoxy material injected into the opening, thereby improving reliability.

In addition, the embodiment can minimize a height of a connection portion disposed on a device as the first protective layer is composed of one layer, and so that, an overall height of a package substrate may be reduced compared to a comparative example. Accordingly, the embodiment can achieve slimming of the package substrate.

FIG. 7 is a view for explaining an underfill process of a package substrate according to an embodiment.

Referring to FIG. 7, an inner wall of the opening 155 of the first protective layer 150 of the circuit board in the embodiment is divided into a first portion 151 and a second portion 152 as described above. In this case, the second portion 152 has a curved surface. Accordingly, a width of the second portion 152 gradually increases toward an upper region according to a predetermined curvature at the upper region of the opening 155.

Accordingly, the embodiment may increase a dispensing space D1 corresponding to a distance from an upper end of the second portion 152 to a lower end of the device 210 compared to the comparative example.

In addition, the embodiment allows the first protective layer 150 to be composed of one layer, so that a thickness of the first protective layer 150 may be reduced compared to the comparative example. In addition, when manufacturing the package substrate, the connection portion provided in the device has a height such that it protrudes with a certain height from the upper surface of the protective layer. Accordingly, the embodiment allows the first protective layer to have a thinner thickness than the comparative example, so that it is possible to reduce the height of the connection portion provided in the device. Accordingly, the embodiment can reduce the distance H3 from the upper surface of the insulating layer 110 to the lower surface of the device compared to the comparative example. Accordingly, the embodiment may reduce an overall thickness of the package substrate.

In addition, when the underfill material 410 is injected into the opening 155 through an underfill dispenser 400, the dispensing space D1 can be secured, and thus stable injection is possible. In addition, the embodiment allows the second portion 152 of the inner wall of the opening 155 to have a curved surface, so that when the underfill material is injected, the underfill material may be introduced into the opening along the curved surface, thereby improving the injectability of the underfill material. For example, when injecting the underfill material, the embodiment can minimize the amount of the underfill material flowing out of the opening compared to the comparative example.

Hereinafter, a method of manufacturing a circuit board according to an embodiment will be described.

FIGS. 8 to 11 are views for explaining a method for manufacturing a circuit board according to a first embodiment shown in FIG. 3 in order of processes.

First, referring to FIG. 8, the embodiment may proceed with a process of preparing an insulating layer 110 and a process of forming a first circuit pattern 120 and a second circuit pattern 130 on the surface of the insulating layer 110. In addition, the embodiment may proceed with a process of forming a through hole penetrating the insulating layer 110 and a process of forming a via 140 connecting the first circuit pattern 120 and the second circuit pattern 130 by filling the inside of the through hole with a metal material.

The insulating layer 110 may be prepreg. The prepreg (PPG) has good flowability and adhesiveness in a semi-cured state, it is used as an intermediate substrate for fiber-reinforced composite materials used as an adhesive layer and an insulating material layer, and is a molding material in which reinforcing fibers are pre-impregnated with a matrix resin. A molded article is formed by laminating these prepregs and curing the resin by heating/pressing. In other words, prepreg refers to a material that is impregnated with resin (BT/Epoxy, FR4, FR5, etc.) into glass fiber and cured to the B-stage.

The insulating layer 110 may be a thermosetting or thermoplastic polymer substrate, a ceramic substrate, an organic-inorganic composite material substrate, or a glass fiber impregnated substrate, and may include an epoxy-based insulating resin when a polymer resin is included, and alternatively, may include a polyimide-based resin.

In addition, the first circuit pattern 120 and the second circuit pattern 130 may be constituted of a plurality of layers.

The plurality of layers constituting the first circuit pattern 120 and the second circuit pattern 130 may include a seed layer and a plating layer. In this case, the seed layer may be a copper foil layer of a CCL (copper clad layer), or may be a chemical copper plating layer formed on the surface of the insulating layer 110 through electroless plating. The seed layer may be a seed layer for forming the plating layer by electroplating. When the seed layer is formed by chemical copper plating, a chemical copper plating layer may be divided into heavy copper plating (2 μm or more), medium copper plating (1~2 (mm) and light copper plating (1 μm or less) based on a thickness.

Next, referring to FIG. 9, the embodiment may proceed with a process of forming a first protective layer 150 on the upper surface of the insulating layer 110 to entirely cover the upper surface of the insulating layer 110 and the first circuit pattern 120. In addition, the embodiment may proceed with a process of forming a second protective layer on the lower surface of the insulating layer 110 to entirely cover the lower surface of the insulating layer 110 and the second circuit pattern 130.

The first protective layer 150 may be formed on the insulating layer 110 to protrude from the upper surface of the first circuit pattern 120 upward with a predetermined height. In addition, the second protective layer 160 may be formed under the lower surface of the insulating layer 110 to protrude from the lower surface of the second circuit pattern 130 downward with a predetermined height.

Next, referring to FIG. 10, the embodiment may proceed with a process of forming openings in the first protective layer 150 and the second protective layer 160.

The openings may include an opening 155 formed in the first protective layer 150 and an opening (not shown) formed in the second protective layer 160.

The opening 155 formed in the first protective layer 150 may vertically overlap a pad 120*a* for mounting of a device among the first circuit patterns 120 disposed on the upper surface of the insulating layer 110.

The opening formed in the second protective layer 160 may vertically overlap a pad on which a solder ball (not shown) for connection to an external substrate (not shown) is mounted among the second circuit patterns 130 disposed on the upper surface of the insulating layer 110.

The opening 155 formed in the first protective layer 150 may be formed by exposure and development processes. Accordingly, an inclination angle of the inner wall of the opening 155 formed by the exposure and development processes may be substantially perpendicular to the upper surface of the insulating layer 110.

Thereafter, as shown in FIG. 11, the embodiment may proceed with a process of processing an opening 155 in the first protective layer 150 using a laser. The process using the laser may be performed on only a portion of the first protective layer 150.

That is, the process of forming the opening 155 using the exposure and development was performed by entirely opening an opening region of the first protective layer 150. Alternatively, the laser process may proceed by partially opening a part of the opening region of the first protective layer 150. Accordingly, the opening 155 may be divided into a portion processed through the exposure and development process and a portion processed through the laser process.

For example, an inner wall of the opening 155 may be divided into a first portion 151 processed through the exposure and development process, and a second portion 152 processed through the laser process. A first portion 151 of the inner wall of the opening 155 may extend upward from the lower surface of the first protective layer 150. In addition, the second portion 152 of the inner wall of the opening 155 may extend downward from the upper surface of the first protective layer 150. The first portion 151 and the second portion 152 of the opening 155 may form an inner wall of the opening 155 or a side surface of the first protective layer 150.

A first portion 151 of the opening 155 may have a first inclination angle. For example, the first portion 151 of the opening 155 may be substantially perpendicular to the upper surface of the insulating layer 110 or the lower surface of the first protective layer 150. The first portion 151 of the opening 155 is formed by exposure and development processes, and thus may have a first surface roughness. For example, the first portion 151 of the opening 155 may be a plane having a first inclination angle.

The second portion 152 may have a curved surface. For example, the second portion 152 may be a curved surface whose width changes from an upper end to a lower end. For example, the second portion 152 of the opening 155 may be a curved surface having a first curvature. The second portion 152 of the opening 155 may be formed by a laser process, thus may have a second surface roughness. For example, the second portion 152 of the opening 155 may have a second surface roughness greater than the first surface roughness of the first portion 151.

In the embodiment, an opening is formed in the first protective layer 150 through two processing processes, and thus, at least a part of the first protective layer 150 has a curved surface. Accordingly, the embodiment enables an underfill material or an epoxy material to be stably injected into the opening 155 through the second portion 152 having the curved surface.

For example, the second portion 152 of the first protective layer 150 has a curved surface. Accordingly, the second portion 152 of the first protective layer 150 has a curved surface, so that a dispensing space determined by a distance from an uppermost end of the second portion 152 to a lower end of the device can be sufficiently secured. In addition, the second portion 152 of the first protective layer 150 has a curved surface, and so that when injecting an underfill material or an epoxy material on the second portion 152 of the first protective layer 150, the underfill material or the epoxy material may naturally flow into the opening 155 along the curved surface of the second portion 152, thereby maximizing the capillary.

Meanwhile, an inner wall of the opening 155 of the first protective layer 150 may entirely have a curved surface as the second portion 152. However, in this case, an underfill material or an epoxy material injected into the opening 155 may flow out of the opening 155. In other words, when the inner wall of the opening 155 has a curved surface as a whole, the inner wall of the opening 155 does not serve as a dam to trap the underfill material or the epoxy material injected into the opening 155, and this may cause an underfill material or an epoxy material injected into the opening 155 to again flow out of the opening 155.

Accordingly, the embodiment allows the first portion 151 of the inner wall of the opening 155 of the first protective layer 150 to have a first inclination. A first inclination of the first portion 151 may be substantially perpendicular to the upper surface of the insulating layer 110.

Accordingly, the embodiment may allow the first portion 151 to function as a dam for confining the underfill material or the epoxy material injected into the opening 155, thereby improving reliability.

The first portion 151 of the inner wall of the opening 155 may have a second height H2. The second height H2 may correspond to a distance from the upper surface of the insulating layer 110 to an uppermost end of the first portion 151 or a thickness of the first portion 151.

The second height H2 of the first portion 151 may be determined by a first height H1 of the pad 120a.

For example, when an underfill material or an epoxy material is injected into the opening 155, the injected underfill material or epoxy material must stably cover at least the upper surface of the pad 120a.

Accordingly, the second height H2 of the first portion 151 corresponds to the first height H1 of the pad 120a, so that the underfill material or the epoxy material can stably cover up to the upper surface where the pad 120a is disposed. Preferably, the second height H2 of the first portion 151 may be the same as the first height H1 of the pad 120a. For example, the second height H2 of the first portion 151 may be 100% to 150% of the first height H1 of the pad 120a.

FIG. 12 is a view showing a circuit board according to a second embodiment.

Referring to FIG. 12, the circuit board according to a second embodiment includes an insulating layer 510, a first circuit pattern 520, a second circuit pattern 530, a via 540, a pad 520a, and a first protective layer 550 and 560, and a second protective layer 570.

Here, components other than the first protective layers 550 and 560 have the same structure as the circuit board according to the first embodiment shown in FIG. 3, and a detailed description thereof will be omitted.

In the circuit board 500 of the second embodiment, the first protective layer may have a two-layer structure. For example, the first protective layer 550 and 560 may include a first-first protective layer 550 and a first-second protective layer 560.

The first-first protective layer 550 may have the same structure as the first protective layer 150 according to the first embodiment of FIG. 3.

For example, the first-first protective layer 550 and the first-second protective layer 560 may include an opening (OR).

In addition, the inner wall of the opening of the first-first protective layer 550 among the openings of the first-first protective layer 550 and the first-second protective layer 560 may be divided into a first portion 551 processed through the exposure and development process and a second portion 552 processed through the laser process. A first portion 551 of the inner wall of the opening may extend upward from a lower surface of the first-first protective layer 550. In addition, the second portion 552 of the inner wall of the opening may extend downward from the upper surface of the first-first protective layer 550.

A first portion 551 of the inner wall of the first-first protective layer 550 may have a first inclination angle. For example, the first portion 551 of the inner wall of the first-first protective layer 550 may be substantially perpendicular to the upper surface of the insulating layer 510 or the lower surface of the first-first protective layer 550.

A second portion 552 of the inner wall of the first-first protective layer 550 may have a curved surface. For example, the second portion 552 may be a curved surface whose width changes from a lower end to an upper end. For example, the second portion 552 of the inner wall of the first-first protective layer 550 may be a curved surface having a first curvature.

The first-first protective layer 550 may have substantially the same structure as the first protective layer 150 in FIG. 3.

A first-second protective layer 560 may be formed on the first-first protective layer 550.

An inner wall 561 of the opening of the first-second protective layer 560 may have a curved surface as a whole. For example, the inner wall 561 of the opening of the first-second protective layer 560 may have a curved surface connected to the second portion 562 of the inner wall of the first-first protective layer 550. In this case, the inner wall 561 of the first-second protective layer 560 may have a second curvature. For example, the second curvature of the inner wall 561 of the opening of the first-second protective layer 560 is greater than the first curvature of the second portion 562 of the inner wall of the first-first protective layer 550. Accordingly, the embodiment further improves the injectability of the underfill material or the epoxy material through the inner wall 561 of the opening of the first-second protective layer 560, while preventing the material from flowing out of the opening.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:

an insulating layer;

a circuit pattern disposed on the insulating layer; and a first protective layer disposed on the insulating layer having a first opening overlapping the circuit pattern in a vertical direction, wherein an inner wall of the first opening of the first protective layer includes:

a first portion connected to a lower surface of the first protective layer and overlapping the circuit pattern in a horizontal direction; and a second portion provided between an upper surface of the first protective layer and the first portion and not overlapping with the circuit pattern in the horizontal direction;

wherein the first portion has a first inclination, and the second portion has a second inclination different from the first inclination, and wherein the second portion has a curved surface having a first curvature.

2. The circuit board of claim 1, wherein the first portion is perpendicular to the lower surface of the first protective layer.

3. The circuit board of claim 1, wherein a surface roughness of the first portion of the first protective layer is different from a surface roughness of the second portion of the first protective layer.

4. The circuit board of claim 1, wherein a height of a boundary between the first portion and the second portion is higher than or equal to a height of the circuit pattern.

5. The circuit board of claim 1, further comprising:

a second protective layer disposed on the first protective layer, wherein the second protective layer includes a second opening vertically overlapping the first opening.

6. The circuit board of claim 5, wherein a width of the second opening is greater than a width of the first opening.

7. The circuit board of claim 5, wherein an inner wall of the second opening of the second protective layer includes a third portion having a third inclination different from the first inclination and the second inclination of the first portion and the second portion of the first protective layer.

8. The circuit board of claim 7, wherein the third portion is a curved surface having a second curvature different from the first curvature of the second portion.

9. The circuit board of claim 8, wherein the second curvature is greater than the first curvature.

10. The circuit board of claim 7, wherein the third portion does not overlap with the first portion in a vertical direction.

11. The circuit board of claim 10, wherein the third portion does not overlap with the second portion in a vertical direction.

12. The circuit board of claim 1, wherein the circuit pattern includes a plurality of pads, and wherein the plurality of pads are overlapped with the first opening in the vertical direction and spaced apart from each other in the horizontal direction.

13. A semiconductor package comprising:

an insulating layer;

a plurality of pads disposed on the insulating layer and spaced apart from each other in a horizontal direction;

a first protective layer disposed on the insulating layer and having a first opening overlapping the plurality of pads in a vertical direction;

a contacting portion disposed on the plurality of pads;

a semiconductor device disposed on the contacting portion; and a molding layer for molding the semiconductor device;

wherein an inner wall of the first opening of the first protective layer includes:

a first portion connected to a lower surface of the first protective layer and overlapping a circuit pattern in a horizontal direction; and a second portion provided between an upper surface of the first protective layer and the first portion and not overlapping with the circuit pattern in the horizontal direction;

wherein the first portion has a first inclination, and the second portion has a second inclination different from the first inclination, wherein the second portion has a curved surface having a first curvature; and wherein the molding layer is provided covering the first and second portions.

14. The semiconductor package of claim 13, wherein a surface roughness of the first portion of the first protective layer is different from a surface roughness of the second portion of the first protective layer.

15. The semiconductor package of claim 13, wherein a height of a boundary between the first portion and the second portion is higher than or equal to a height of each of the plurality of pads.

16. The semiconductor package of claim 13, further comprising:

a second protective layer disposed on the first protective layer, wherein the second protective layer includes a second opening vertically overlapping the first opening, and wherein the molding layer is provided covering an inner wall of the second opening.

17. The semiconductor package of claim 16, wherein a width of the second opening is greater than a width of the first opening, and wherein the inner wall of the second opening of the second protective layer includes a third portion having a third inclination different from the first inclination and the second inclination of the first portion and the second portion of the first protective layer.

18. The semiconductor package of claim 17, wherein the third portion is a curved surface having a second curvature different from the first curvature of the second portion.

19. The semiconductor package of claim 18, wherein the second curvature is greater than the first curvature.

20. The semiconductor package of claim 17, wherein the third portion does not overlap with the first portion in a vertical direction.

* * * * *